United States Patent
Izumi

(10) Patent No.: US 7,887,279 B2
(45) Date of Patent: Feb. 15, 2011

(54) AUTOMATED STORAGE AND RETRIEVAL SYSTEM WITH IMPROVED STORAGE EFFICIENCY AND METHOD OF STORING ARTICLES IN, AND RETRIEVING ARTICLES FROM THE AUTOMATED STORAGE AND RETRIEVAL SYSTEM

(75) Inventor: Takanori Izumi, Kyoto (JP)

(73) Assignee: Murata Machinery, Ltd., Kyoto-shi (JP)

( * ) Notice: Subject to any disclaimer, the term of this patent is extended or adjusted under 35 U.S.C. 154(b) by 726 days.

(21) Appl. No.: 11/896,316

(22) Filed: Aug. 31, 2007

(65) Prior Publication Data

US 2008/0124201 A1 May 29, 2008

(30) Foreign Application Priority Data

Sep. 4, 2006 (JP) .............................. 2006-238584

(51) Int. Cl.
*B65G 1/00* (2006.01)
(52) U.S. Cl. ....................................... 414/281; 414/807
(58) Field of Classification Search ................. 414/260, 414/281, 608, 662, 807
See application file for complete search history.

(56) References Cited

U.S. PATENT DOCUMENTS

| | | | | |
|---|---|---|---|---|
| 2,667,983 A * | 2/1954 | Billings | ....................... | 414/661 |
| 4,232,988 A * | 11/1980 | Kochanneck | ............ | 414/331.02 |
| 5,147,176 A * | 9/1992 | Stolzer et al. | ................ | 414/807 |
| 5,199,531 A * | 4/1993 | Malin | .......................... | 187/224 |
| 5,207,555 A * | 5/1993 | Shirai | .......................... | 414/662 |
| 5,362,192 A | 11/1994 | Dang | | |
| 5,674,040 A | 10/1997 | Wagner | | |
| 6,224,313 B1 | 5/2001 | Fukushima et al. | | |
| 6,390,756 B1 * | 5/2002 | Isaacs et al. | ................. | 414/281 |
| 2004/0197171 A1 * | 10/2004 | Freudelsperger | ............ | 414/281 |

FOREIGN PATENT DOCUMENTS

| | | |
|---|---|---|
| JP | 56-099103 A | 8/1981 |
| JP | 61-060505 A | 3/1986 |
| JP | 62-194605 U | 12/1987 |
| JP | 4-292312 A | 10/1992 |
| JP | 7-242306 A | 9/1995 |
| JP | 09-205127 A | 8/1997 |
| JP | 11-208818 A | 8/1999 |

OTHER PUBLICATIONS

European Search Report dated Jan. 30, 2008, issued in corresponding European Patent Application No. 07016451.
Japanese Notification of Reason(s) for Refusal dated Apr. 4, 2008, issued in corresponding Japanese patent application No. 2006-238584.

* cited by examiner

*Primary Examiner*—Saúl J Rodríguez
*Assistant Examiner*—Joshua I Rudawitz
(74) *Attorney, Agent, or Firm*—Westerman, Hattori, Daniels & Adrian, LLP

(57) ABSTRACT

A pair of carousels is provided in an automated storage and retrieval system. A mast, a pair of elevation frames, and a pair of scara arms are provided between the carousels. One of the scara arms includes a plurality of arms stacked from lower to upper arms such that a hand of the scara arm takes a high position. The other of the scara arms includes a plurality of arms stacked from upper to lower arms such that a hand of the scara arm takes a low position.

6 Claims, 4 Drawing Sheets

AUTOMATED STORAGE AND RETRIEVAL SYSTEM WITH IMPROVED STORAGE EFFICIENCY AND METHOD OF STORING ARTICLES IN, AND RETRIEVING ARTICLES FROM THE AUTOMATED STORAGE AND RETRIEVAL SYSTEM

TECHNICAL FIELD

The present invention relates to an automated storage and retrieval system. In particular, the present invention relates to improvement of storage efficiency in the automated storage and retrieval system.

BACKGROUND ART

In a known technique for the automated storage and retrieval system (Japanese Patent Publication No. 1992-292312), a mast for elevating and lowering a transfer apparatus is provided to face a carousel, the carousel is rotated for orienting a desired rack opening toward the transfer apparatus, and the transfer apparatus is elevated and lowered to the height of a target shelf. In the automated storage and retrieval system, the article can be retrieved from, and stored in an arbitrary rack opening of the carousel. However, since the transfer apparatus and an elevation mechanism for the transfer apparatus are wide in the height direction, dead spaces may be created along the height direction of the rack, and the desired storage efficiency in the automated storage and retrieval system cannot be achieved.

DISCLOSURE OF THE INVENTION

Problems to be Solved by the Invention

An object of the present invention is to improve storage efficiency in an automated storage and retrieval system.

Another object of the present invention is to operate at least a pair of transfer apparatuses without interference to each other.

Still another object of the present invention is to achieve further improvement of storage efficiency.

Means for Solving the Problems

According to the present invention, an automated storage and retrieval system comprises at least a pair of transfer apparatuses for transfer of articles to and from a rack including a plurality of shelves. Each of the transfer apparatuses include a plurality of vertically overlapped parts from a proximal side to a distal side, and attached to an elevation frame. The elevation frame is elevated and lowered along a mast.

In one of the at least the pair of transfer apparatuses, the plurality of parts are arranged from the proximal side to the distal side, in an order from lower to upper parts, and in the other of the at least the pair of transfer apparatuses, the plurality of parts are arranged from the proximal side to the distal side, in an order from upper to lower parts.

The one of the pair of transfer apparatuses is used for a shelf at the highest level, the other of the pair of transfer apparatuses is used for a shelf at the lowest level.

Preferably, the rack is a carousel rotatable in a horizontal direction. The pair of transfer apparatuses are provided respectively to face the carousel.

Further, preferably, a pair of elevation frames are elevated and lowered along the mast. The at least pair of transfer apparatuses are provided on the pair of elevation frames.

Further, according to another aspect of the present invention, a method of storing articles in, and retrieving the articles from an automated storage and retrieval system is provided, and the method comprises the steps of:

providing at least a pair of transfer apparatuses on at least one elevation frame being elevated and lowered along a mast, in one of the at least the pair of transfer apparatuses, a plurality of parts being arranged from a proximal side to a distal side, in an order from lower to upper parts, and in the other of the at least the pair of transfer apparatuses, a plurality of parts being arranged from the proximal side to the distal side, in an order from upper to lower parts;

providing at least one rack including a plurality of shelves at a plurality of levels in a height direction; and storing the articles in, and retrieving the articles from the rack using the one of the pair of transfer apparatuses for a shelf of the rack at the highest level, and using the other of the pair of the transfer apparatuses for a shelf of the rack at the lowest level.

Further, according to still another aspect of the present invention, a method of storing articles in, and retrieving the articles from an automated storage and retrieval system is provided, and the method comprises the steps of:

providing a pair of elevation frames for a mast;

providing transfer apparatuses on the pair of elevation frames, respectively;

in one of the pair of transfer apparatuses, arranging a plurality of parts from a proximal side to a distal side, in an order from lower to upper parts, and in the other of the pair of transfer apparatuses, arranging a plurality of parts from the proximal side to the distal side, in an order from upper to lower parts;

providing a pair of racks including a plurality of shelves at a plurality of levels in a height direction on both sides of the mast;

storing the articles in, and retrieving the articles from a shelf at the highest level, of each of the racks using the one of the pair of transfer apparatuses, and storing the articles in, and retrieving the articles from a shelf at the lowest level, of each of the racks using the other of the pair of transfer apparatuses.

ADVANTAGES OF THE INVENTION

In the present invention, one of at least a pair of transfer apparatuses can transfer articles from a shelf at the highest level, and the other transfer apparatus can transfer articles from the shelf at the lowest level. Thus, transfer in the entire area of the rack covering shelves at low positions and high positions is possible. Therefore, it is possible to provide the rack without providing dead spaces corresponding to the thickness of the transfer apparatuses in the height direction, and improvement in the efficiency of storing the articles is achieved.

The racks are not limited to carousels. Alternatively, non-moving racks may be used. However, in the case of using the non-moving racks, travel of a mast for the transfer apparatuses is required. Therefore, the two transfer apparatuses may interfere with each other undesirably. In contrast, in the case of using the carousels, since the transfer apparatuses do not interfere with each other, improvement in the operating efficiency of the transfer apparatuses is achieved, and the cycle time in storage in, and retrieval from the storage and retrieval system is reduced advantageously.

By elevating and lowering a pair of elevation frames along the mast, it is possible to minimize the space for providing the mast or the like. Since the required space is minimized, stor-

Figure 1:
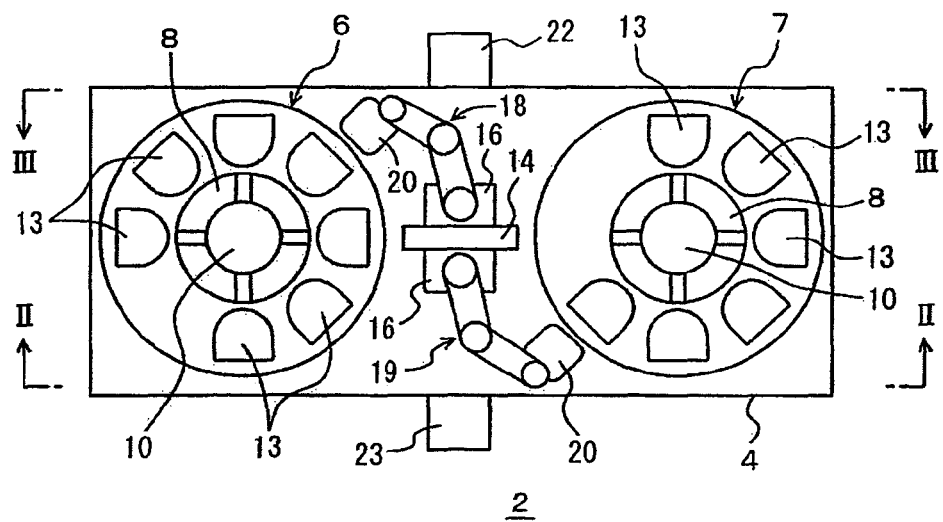
FIG. 1 is a plan view schematically showing an automated storage and retrieval system according to an embodiment.

DESCRIPTION OF THE NUMERALS 2, 42: automated storage and retrieval system
4: frame
6, 7: carousel
8: air passage
10: rotation drive
12: shelf
13: article
14: mast
16: elevation frame
18, 19: scara arm
20: hand
22, 23: load port
24: guide groove
26: fan filter unit
30 to 32: joint
33, 34: arm
36: article support
38: shutter
44, 45: mast
46, 47: load port

EMBODIMENTS

FIGS. 1 to 5 show an automated storage and retrieval system 2 according to an embodiment. The automated storage and retrieval system 2 is provided, e.g., in a clean room, and stores articles 13 such as semiconductor cassettes or reticle cassettes. A reference numeral 4 denotes a frame 4. For example, a pair of carousels 6, 7 are provided in the frame 4. Air passages 8 are provided in the carousels 6, 7. For example, a clean air or a clean gas is supplied from fan filter units 26 or the like shown in FIG. 2. Further, preferably, a rotation drive 10 is provided in each of the carousels 6, 7 to rotate the carousels 6, 7. Reference numerals 12 denote shelves for storing the articles 13. The shelves 12 are divided by a plurality of article supports. Each of the carousels 6, 7, can be rotated in its entirety. Alternatively, the carousels 6, 7 may be divided in a vertical direction into a plurality of upper and lower parts each including two or three shelves such that each part can be rotated independently.

A reference numeral 14 denotes a mast provided between the pair of carousels 6, 7. Elevation frames 16 are provided on one surface and on the other surface of the mast 14, respectively, for independently elevating and lowering the carousels 6, 7. A scara arm 18 is provided on one of the elevation frames 16, and a scara arm 19 is provided on the other of the elevation frames 16. Reference numerals 20 denote hands of the scara arms 18, 19. Reference numerals 22, 23 denote load ports. The scara arm 18 uses the load port 22, and the scara arm 19 uses the load port 23. Further, the scara arms 18, 19 can transfer articles to, and from both of the carousels 6, 7.

Figure 2:
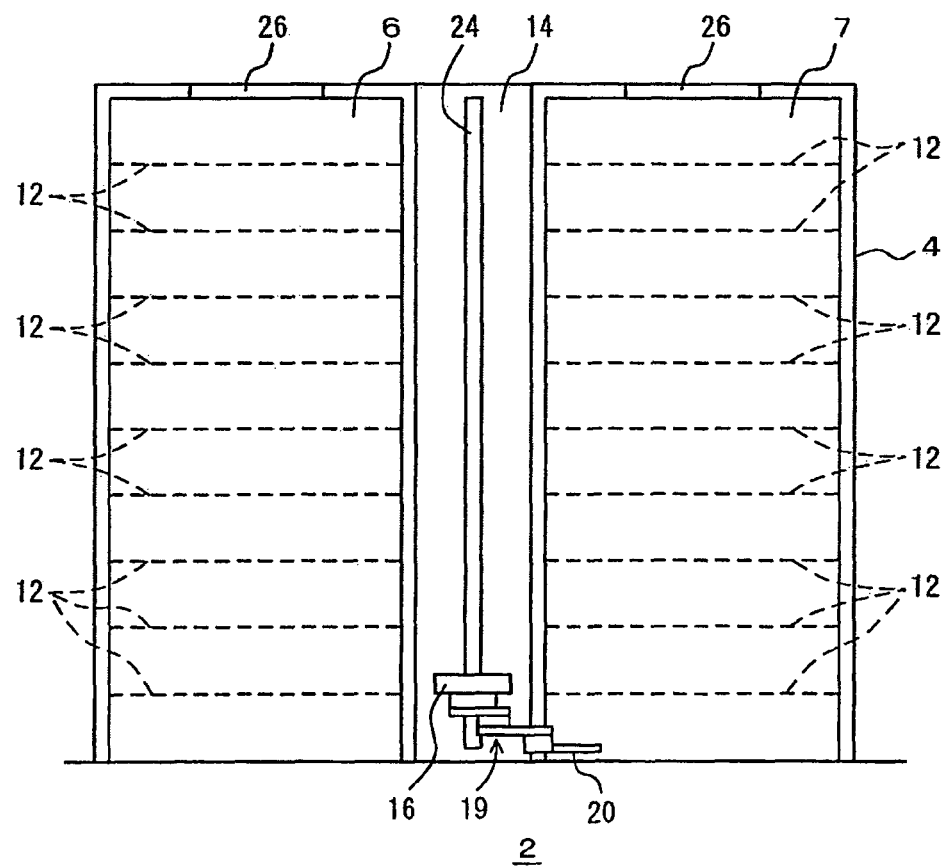
FIG. 2 is a side view schematically showing the automated storage and retrieval system according to the embodiment, taken along a line II-II in FIG. 1.
Figure 3:
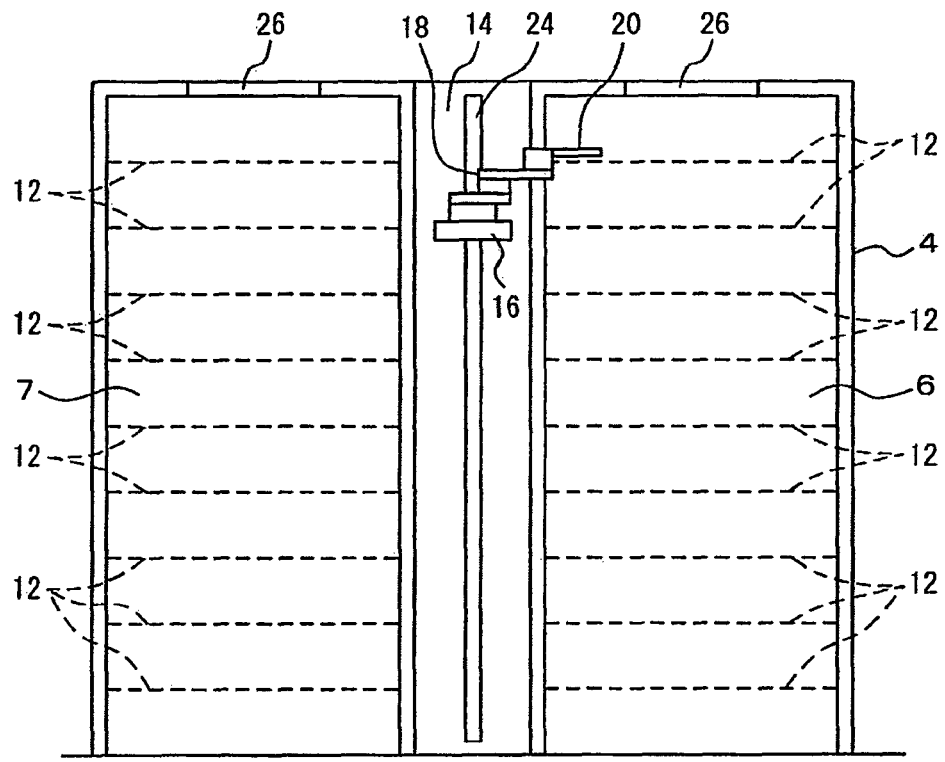
FIG. 3 is a side view schematically showing the automated storage and retrieval system according to the embodiment, taken along a line III-III in FIG. 1.

As shown in FIGS. 2 and 3, the elevation frame 16 is elevated and lowered along a guide groove 24 provided in the mast 14. The elevation frame 16 is elevated and lowered synchronously with rotation of the carousel 6 or 7. The clean air or the clean gas is supplied to the air passages 8 in the carousels 6, 7 by the fan filter units 26. The carousels 6, 7 are pressurized internally for preventing entry of dust from the outside. The rotation drive 10 is sealed hermetically for prevention of dust emission.

Figure 4:
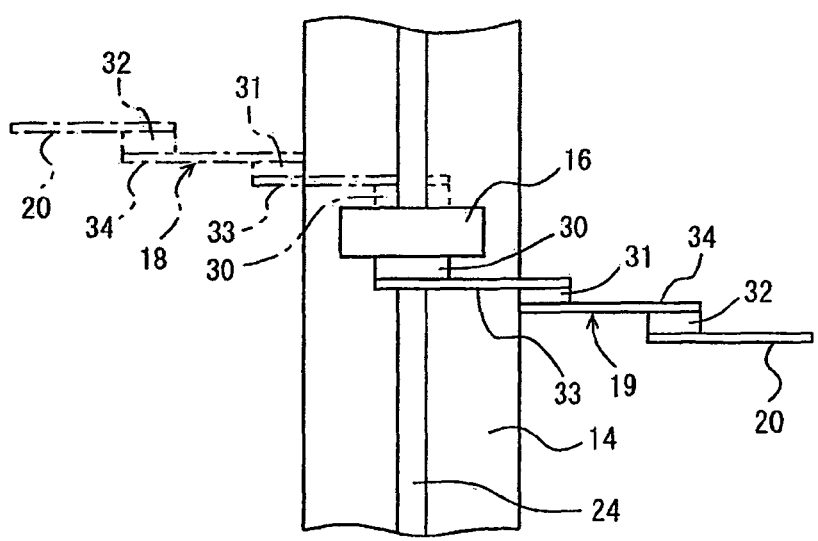
FIG. 4 is a view showing the relationship between upper and lower arms according to the embodiment. The lower arm is denoted by a solid line, and an upper arm is denoted by a chain line.

As shown in FIG. 4, each of the scara arms 18, 19 includes joints 30, 31, 32, arms 33, 34, and a hand 20 at its distal end. The scara arm 18 is formed by stacking a plurality of parts from lower to upper parts, i.e., from the joint 30 to the hand 20. The position of the hand 20 of the scara arm 18 is higher than the proximal portion of the scara arm 18. In the scara arm 19, parts are jointed downwardly from the joint 30 to the hand 20. The position of the hand 20 of the scara arm 19 is lower than the proximal portion of the scara arm 19. The hand 20 and the arm 34 are overlapped at the joint 32, and the arm 34 and the arm 33 are overlapped at the joint 31. The scara arms 18, 19 can transfer articles to and from both of the left and right carousels 6, 7. Further, the scara arms 18, 19 can transfer articles to and from the load port 22 or the load port 23. For this purpose, the joints 30, 31, 32 can be operated independently.

Figure 5:
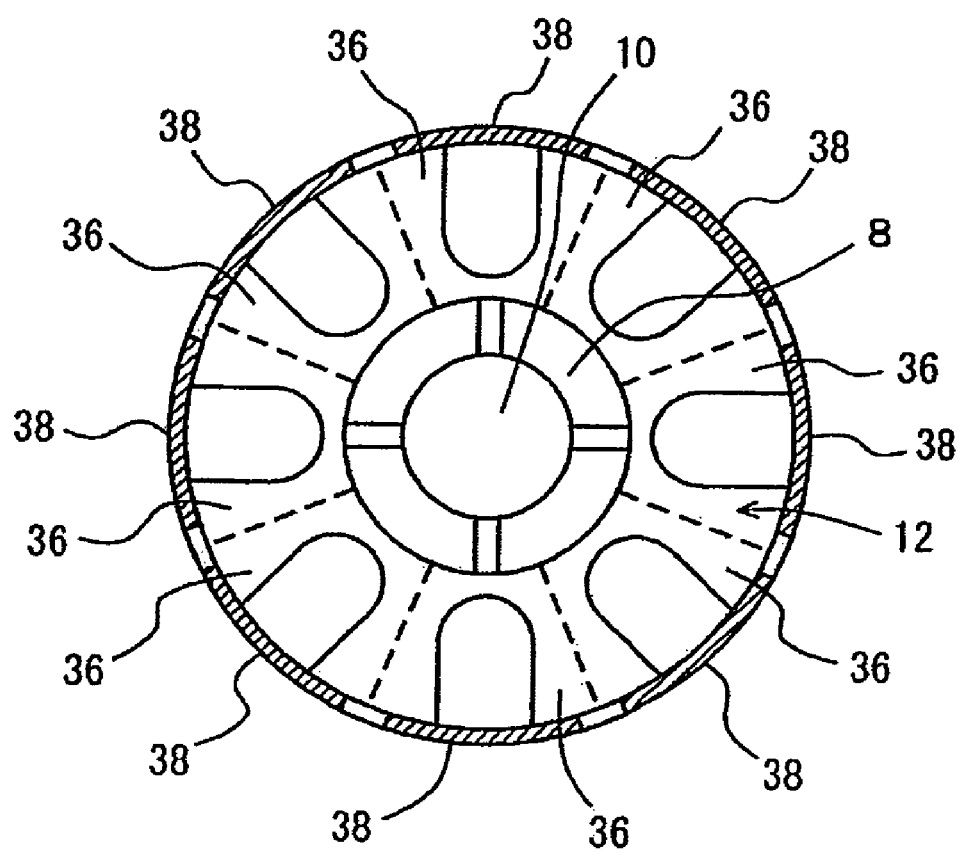
FIG. 5 is a cross sectional view in a horizontal direction, showing structure of a carousel according to the embodiment.

FIG. 5 shows structure of the carousel 6. The carousel 7 has the same structure. The shelves 12 are divided by a plurality of article supports 36. A shutter 38 is provided at a rack opening of each of the article supports 36. By an opening and closing mechanism (not shown), the shutter 38 is opened and closed synchronously with operation of the hand 20. In the carousels 6, 7, the clean air or the like from the fan filter units 26 is supplied to the respective shelves 12 through the air passages 8. In the case where the shelves 12 are divided into groups of two shelves, or three shelves, and each group can be rotated independently, the scara arms 18, 19 can perform transfer operation to, and from the common carousel 6 or the like at the same time. During transfer operation by the scara arms 18, 19, the other shelves which are not used in the current transfer operation can be rotated independently in preparation for the next transfer operation. Alternatively, each of the carousels 6, 7 may be rotated in its entirety.

Advantages of the embodiment will be described.

1) The scara arm 19 can transfer articles to and from shelves at the lowest level of the carousels 6, 7. The scara arm 18 can transfer articles to and from shelves at the highest level of the carousels 6, 7. Both of the scara arms 18, 19 can be used for the other shelves. In the structure, the shelves 12 can be provided over the entire height of the automated storage and retrieval system 2. Improvement of efficiency for storing the articles 13 is achieved.

2) A pair of the scara arms 18, 19 are used for a pair of the carousels 6, 7. Therefore, the articles can be transferred efficiently, and the cycle time for retrieval and storage can be reduced. In the case where the carousels 6, 7 are divided in a plurality of parts, and each of the parts is rotatable independently, by rotating the parts in preparation for the next transfer, further reduction in the cycle time is achieved.

3) By elevating and lowering a pair of the elevation frames 16 using the common mast 14, the required space is further reduced. Therefore, improvement of storage efficiency is achieved, and it is possible to use a mast having high rigidity as the mast 14.

4) By supplying the clean air or the clean gas into the carousels 6, 7 under pressure, it is possible to store the articles 13 in a clean environment.

Figure 6:
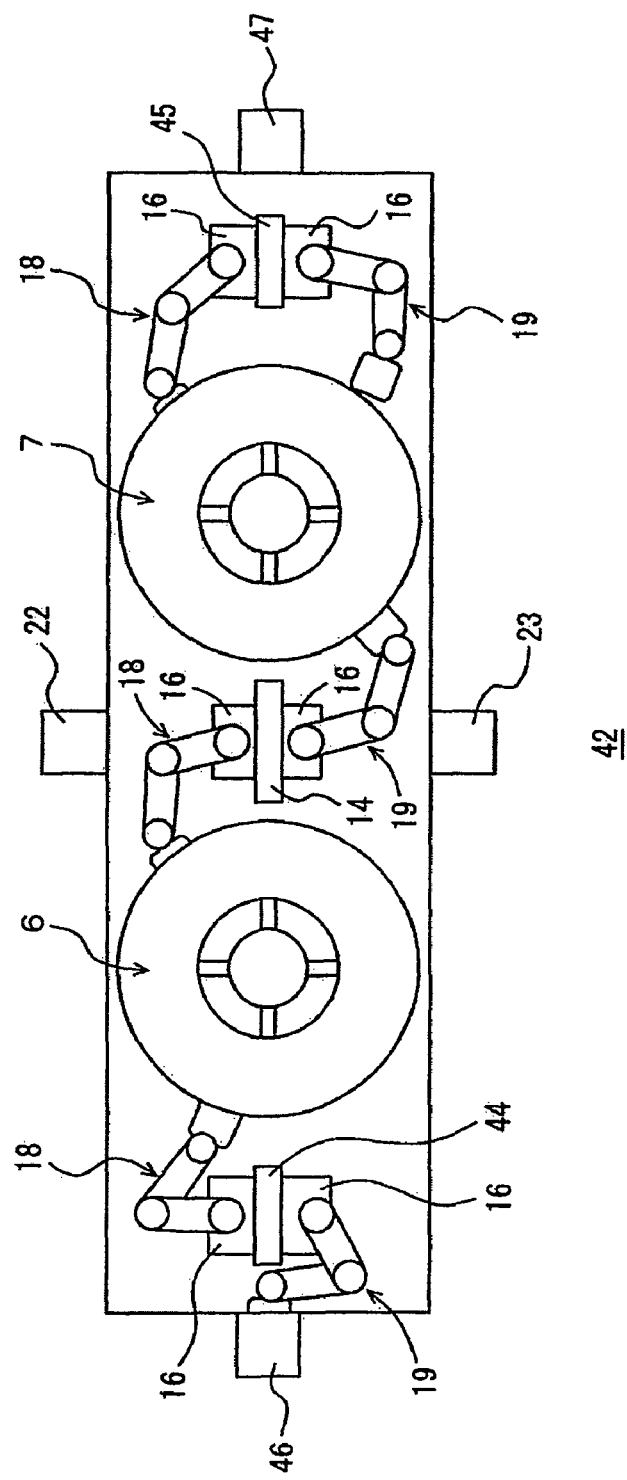
FIG. 6 is a plan view schematically showing an automated storage and retrieval system according to a modified embodiment.

FIG. 6 shows an automated storage and retrieval system 42 according to a modified embodiment. Unless specifically noted, the features of the automated storage and retrieval system 42 are the same as those shown in FIGS. 1 to 5. In the automated storage and retrieval system 42, masts 44, 45 are provided additionally at both of the left and right ends, and a pair of elevation frames 16 are provided for each of the masts 44, 45. Scara arms 18, 19 are provided for transfer of articles to and from the outside through the load ports 46, 47. As a result, in total, six scara arms 18, 19 can be used for the pair of carousels 6, 7. In this manner, further reduction in the cycle time is achieved.

Although the embodiments have been described in connection with the case of transfer between the carousels 6, 7 and the scara arms 18, 19, instead of the carousels 6, 7, non-moving racks may be provided. In this case, the scara arms 18, 19 can be elevated, and lowered, and can travel horizontally for transfer to and from the non-moving racks. Further, the transfer means is not limited to the scara arms 18, 19, as long as it has a plurality of parts, and the parts are overlapped with each other. In the embodiment, shelves in one level in the height direction are only used by the scara arm 18 or the scara arm 19. Depending on the thickness of the scara arms 18, 19 in the height direction, shelves in two or more levels in the height direction are only used by the scara arm 18 or the scara arm 19.

The invention claimed is:

1. An automated storage and retrieval system, comprising:
   a mast,
   at least one rack including a plurality of shelves,
   at least two elevation frames which are independently elevated and lowered along said mast, and
   at least two transfer apparatuses for transfer of articles to and from said rack,
   wherein a first one of said at least two transfer apparatuses is provided on a first one of said at least two elevation frames,
   wherein a second one of said at least two transfer apparatuses is provided on a second one of said at least two elevation frames,
   wherein in said first one of said at least two transfer apparatuses, a first plurality of vertically overlapped arms are arranged from the proximal side to the distal side such that more a distal arm is disposed above a more proximal arm,
   wherein in said second one of said at least two transfer apparatuses, a second plurality of vertically overlapped arms are arranged from the proximal side to the distal side such that a more proximal arm is disposed above a more distal arm,
   wherein said first one of said at least two transfer apparatuses is capable of storing articles on, and retrieving articles from, a shelf at the highest level, and
   wherein said second one of said at least two transfer apparatuses is capable of storing articles on, and retrieving articles from, a shelf at the lowest level.

2. The automated storage and retrieval system according to claim 1,
   wherein said rack is a carousel rotatable in a horizontal direction, and
   wherein said at least two transfer apparatuses respectively face the carousel.

3. The automated storage and retrieval system according to claim 2,
   wherein a first hand is attached to a most distal and highest one of said first plurality of vertically overlapped arms of said first one of said at least two transfer apparatuses, and
   wherein a second hand is attached to a most distal and lowest one of said second plurality of vertically overlapped arms of said second one of said at least two transfer apparatuses.

4. The automated storage and retrieval system according to claim 1,
   wherein a first hand is attached to a most distal and highest one of said first plurality of vertically overlapped arms of said first one of said at least two transfer apparatuses, and
   wherein a second hand is attached to a most distal and lowest one of said second plurality of vertically overlapped arms of said second one of said at least two transfer apparatuses.

5. A method of storing articles in, and retrieving the articles from an automated storage and retrieval system, the method comprising the steps of:
   providing said automated storage system including
      a mast,
      at least two elevation frames which are independently elevated and lowered along said mast, and
      at least two transfer apparatuses, a first one of said at least two transfer apparatuses being provided on a first one of said at least two elevation frames and including a first plurality of vertically overlapped arms arranged from the proximal side to the distal side such that a more distal arm is disposed above a more proximal arm, a second one of said at least two transfer apparatuses being provided on a second one of said at least two elevation frames and including a second plurality of vertically overlapped arms arranged from the proximal side to the distal side such that a more proximal arm is disposed above a more distal arm,
   providing a pair of racks each including a plurality of shelves at a plurality of levels in a height direction on both sides of the mast;
   storing the articles in, and retrieving the articles from, a shelf at the highest level of each of the racks using said first one of said at least two transfer apparatuses, and
   storing the articles in, and retrieving the articles, from a shelf at the lowest level of each of the racks using said second one of said at least two transfer apparatuses.

6. The method according to claim 5, wherein the pair of racks are carousels rotatable in a horizontal direction.

* * * * *